(12) United States Patent
Racine et al.

(10) Patent No.: US 8,063,559 B2
(45) Date of Patent: Nov. 22, 2011

(54) LIGHT-EMITTING PANEL FOR ILLUMINATING OR DISPLAYING IMAGES PROVIDED WITH A COMPOSITE TRANSPARENT UPPER ELECTRODE

(75) Inventors: Benoit Racine, Renage (FR); David Vauffrey, Grenoble (FR); Gunther Haas, Saint Egreve (FR)

(73) Assignee: Thomson Licensing, Boulogne-Billancourt (FR)

( * ) Notice: Subject to any disclaimer, the term of this patent is extended or adjusted under 35 U.S.C. 154(b) by 292 days.

(21) Appl. No.: 11/920,446

(22) PCT Filed: May 16, 2006

(86) PCT No.: PCT/EP2006/062355
§ 371 (c)(1),
(2), (4) Date: Jun. 22, 2009

(87) PCT Pub. No.: WO2006/125735
PCT Pub. Date: Nov. 30, 2006

(65) Prior Publication Data
US 2009/0302755 A1    Dec. 10, 2009

(51) Int. Cl.
*H01L 51/50* (2006.01)
*H01L 51/52* (2006.01)
*H01L 51/54* (2006.01)
*H01L 27/28* (2006.01)

(52) U.S. Cl. .................. 313/509; 313/503; 313/506

(58) Field of Classification Search .......... 313/498–512; 315/169.1, 169.3; 257/40, 72, 98–100, 642–643, 257/759
See application file for complete search history.

(56) References Cited

U.S. PATENT DOCUMENTS

| 5,739,545 | A | 4/1998 | Guha et al. |
| 7,057,209 | B2* | 6/2006 | Yamazaki et al. ............... 257/88 |
| 7,116,044 | B2 | 10/2006 | Fukunaga |
| 7,396,580 | B2* | 7/2008 | Kawashima et al. ......... 428/212 |
| 7,411,223 | B2* | 8/2008 | Liu et al. ......................... 257/99 |
| 7,531,958 | B2* | 5/2009 | Nishikawa et al. ........... 313/504 |
| 2003/0038593 | A1* | 2/2003 | Aziz et al. ..................... 313/506 |
| 2005/0017631 | A1* | 1/2005 | Liedenbaum et al. ........ 313/505 |
| 2006/0035015 | A1* | 2/2006 | Raychaudhuri et al. ........ 427/66 |
| 2007/0222379 | A1* | 9/2007 | Yamazaki et al. ............ 313/509 |

FOREIGN PATENT DOCUMENTS

| EP | 0838976 | 4/1998 |
| EP | 0977286 | 2/2000 |
| JP | 200233198 | 1/2002 |
| JP | 2005085487 | 3/2005 |
| WO | WO 2004/049465 | 6/2004 |

OTHER PUBLICATIONS

Search Report Dated Jul. 18, 2006.

* cited by examiner

*Primary Examiner* — Nimeshkumar D Patel
*Assistant Examiner* — Jose M Diaz
(74) *Attorney, Agent, or Firm* — Robert D. Shedd; Jeffrey M. Navon

(57) ABSTRACT

At least one of the upper electrodes of the panel is common to a plurality of diodes and comprises a first conducting layer and a second conducting layer, with a transparent insulating buffer layer interposed between these two conducting layers and which is pierced by windows that provide direct contact zones for direct contact between these two conducting layers of this common electrode, these contact zones being separate from the active zones of the diodes. Thanks to the direct contact zones between the two conducting layers, the upper electrode ensures good distribution of the current, while the intermediate buffer layer is insulating.

11 Claims, 1 Drawing Sheet

Figure 1:
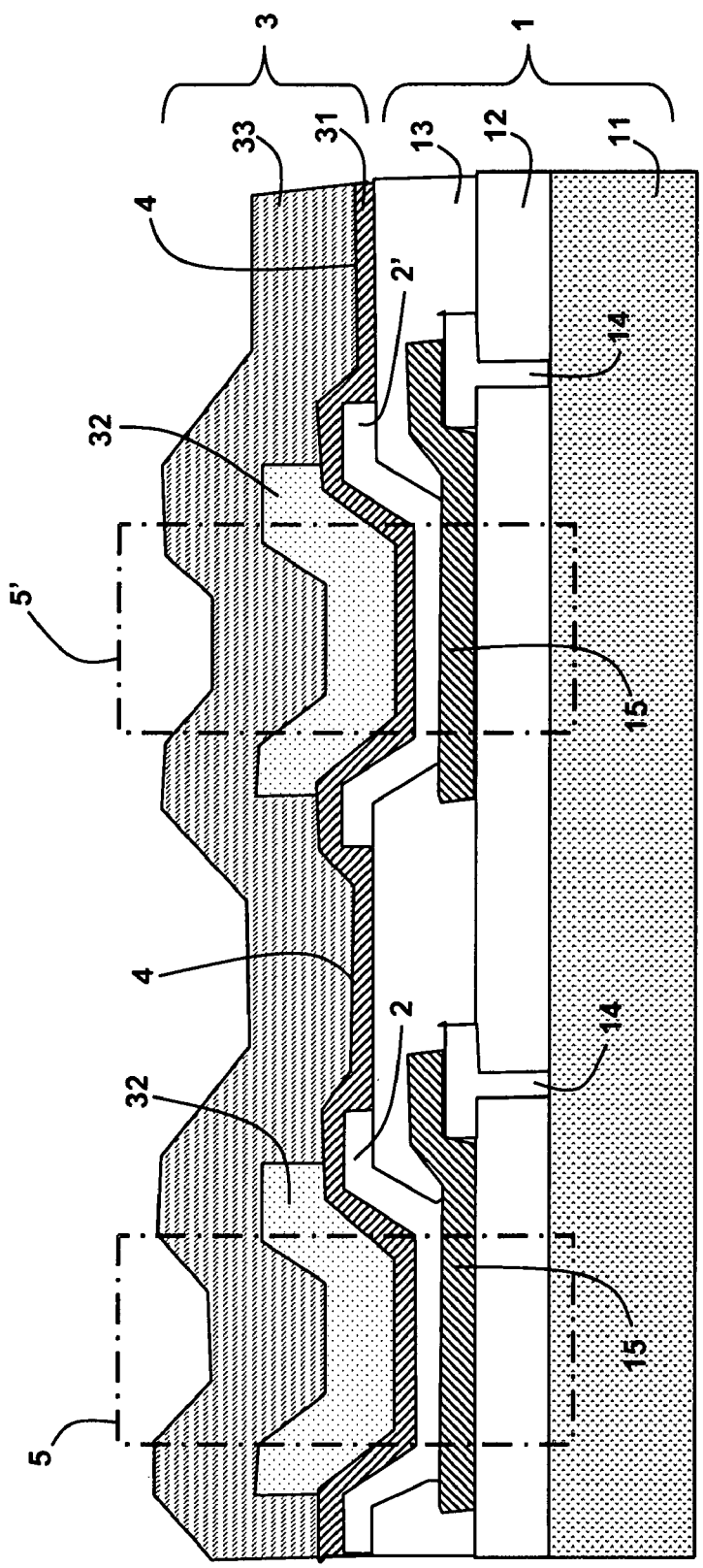

LIGHT-EMITTING PANEL FOR ILLUMINATING OR DISPLAYING IMAGES PROVIDED WITH A COMPOSITE TRANSPARENT UPPER ELECTRODE

This application claims the benefit, under 35 U.S.C. §365 of International Application PCT/EP2006/062355, filed May 16, 2006, which was published in accordance with PCT Article 21(2) on Nov. 30, 2006 in French and which claims the benefit of French patent application No. 0551338, filed May 23, 2005.

The invention relates to illuminating or image-display panels comprising an array of organic light-emitting diodes supported by a substrate.

The prior art describes such panels, in which each diode comprises an organic electroluminescent layer interposed between a lower electrode in contact with the substrate and an upper electrode which is transparent to the light emitted by this organic electroluminescent layer. These are therefore what are called "top-emitting" panels. Depending on the case, the upper electrodes are cathodes (for a "conventional" diode structure) or anodes (for an "inverse" structure).

In general, there are other organic layers between the electrodes, such as layers for injecting and transporting holes or electrons and/or layers for optimizing light extraction, especially using the resonance effect in the optical cavities between the electrodes.

The prior art also describes such panels in which upper electrodes are common to at least one plurality of diodes and comprise a conducting oxide layer, generally a mixed indium tin oxide (ITO) or a mixed indium zinc oxide (IZO).

The fabrication of such a panel requires the deposition of the ITO conducting oxide layer on top of the organic layers. However, it is known that the usual conditions for such a deposition, notably the thermal conditions or the application of a magnetron sputtering plasma, run the risk of degrading the subjacent organic layers.

To avoid or limit this risk, the prior art presents many solutions.

Document U.S. Pat. No. 5,969,474 proposes to insert a buffer layer between the organic layers of the diodes and the transparent conductive oxide layer. This buffer layer is intended to protect the organic layers during deposition of the conductive oxide layer, especially to prevent its oxidation. As buffer layer material, said document proposes a metallic conducting material based on titanium, chromium or tantalum, or else a nitride of such a metal. Thus, in the panels described in that document, upper electrodes are common to a plurality of diodes and comprise a metallic first conducting layer with a thickness equal to or less than 20 nm, and a second conducting layer, made of ITO or IZO, in contact with this first layer. This second layer generally has a thickness equal to or greater than 50 nm, and therefore greater than that of the first layer. It should be noted that the thickness of this buffer layer remains very small, i.e. less than 20 nm. Specifically when nitrides are used (Example 2 in that document), the thickness is then only 5 nm in order to maintain sufficiently high transparency and conductivity.

Document WO 2004/049465 indicates that such metallic buffer layers must have a sufficient thickness (>30 nm) to be effective as protection, but that, owing to this large thickness, the upper electrode then loses a significant amount of its transparency, which is detrimental to the luminous efficiency. That document proposes to dope metallic buffer layers with SiO in order to make them more protective and more transparent.

Documents U.S. Pat. Nos. 6,172,459 and 6,140,763 disclose materials for relatively thick buffer layers based on porphyrinic organic compounds, which have the advantage of being conductive, protective and transparent.

The object of the invention is to provide a different and more economical solution for limiting the risk of degradation of the organic layers during deposition of the transparent upper electrodes.

For this purpose, the subject of the invention is an illuminating or image-display panel, comprising an array of organic light-emitting diodes supported by a substrate, at least one array of lower electrodes in contact with the substrate and an array of upper electrodes, in which each diode comprises an organic electroluminescent layer which is interposed between a lower electrode and an upper electrode, which is itself transparent to the light emitted by this diode, in which at least one of said upper electrodes is common to a plurality of diodes and comprises a first conducting layer and a second conducting layer, with a transparent insulating buffer layer interposed between these two conducting layers, and in which, with the active zone of each diode being defined as the area of the organic electroluminescent layer of this diode that is in direct contact both with a lower electrode and an upper electrode, for each said upper electrode (3) common to a plurality of diodes, said buffer layer is pierced by windows that provide direct contact zones for direct contact between the two conducting layers of this common electrode, these contact zones being separate from the active zones of the diodes of said plurality.

The windows of the buffer layer are in general apertures or "holes" made in this layer. It should be noted that, in the panels described in documents U.S. Pat. Nos. 6,172,459 and 6,140,763, the buffer layers do not have windows or apertures, nor do they therefore have zones in which the two conducting layers of the upper electrode are in direct contact with each other, without an intermediate buffer layer. This is because such a direct contact is unnecessary for establishing a conducting bridge, since the buffer layer itself is conducting. There is no advantage in having windows or apertures made in the buffer layers described in document U.S. Pat. No. 5,739,545, which are especially made of ZnSe or ZnS, since, here again, the buffer layers are conducting through its grain boundaries.

The first conducting layer of each upper electrode common to several diodes is in contact with the organic electroluminescent layer. The active zone of each diode is defined more precisely as the zone of superposition between the lower electrode and the upper electrode of this diode. It is therefore only in this superposition zone that the organic electroluminescent layer is subjected to an electric field when the diode is turned on and emits light; outside these active zones, there is no light emission.

Each overlap zone, that is to say each cross-over or superposition zone, of a lower electrode and of an upper electrode therefore corresponds to a diode. The active zone of this diode therefore corresponds to the area of the organic electroluminescent layer of this diode which is in direct contact both with this lower electrode and with this upper electrode, and which is capable of transmitting the light emitted by this diode.

Preferably, for each upper electrode, said direct contact zones are not superposed with any active zone of the diodes having an upper electrode in common. This means that the windows or apertures made in the buffer layer, which correspond to the contact zones between the two conducting layers of the upper electrode in question, are located outside the active zones. Thus, if the deposition of the second conducting layer in the region of these contact zones causes degradation of the possible subjacent organic layers, such degradation is not a problem since it takes place outside the active zones of the diodes.

The organic electroluminescent layer of the diodes may be common to several diodes. The array of upper electrodes may have only a single electrode, which is then common to all the diodes.

The diodes of the panel are "top-emitting" diodes, since the upper electrodes are transparent, at least at the locations of the diodes. These electrodes may also be semitransparent, for example to modify the intrinsic emission colorimetry of the diodes and/or to adjust the optical cavity effects between the electrodes so as to improve the light extraction.

Preferably, the buffer layer has an insulating character. Preferably, for each said upper electrode, the surface conductivity of the buffer layer is less than one tenth of the surface conductivity of the second conducting layer of this upper electrode. The surface conductivity of a layer means the conductivity of a square surface element of this layer. Thus, in the case of a buffer layer made of a nitride-based material as in example 2 of document U.S. Pat. No. 5,969,474, the thickness of the buffer layer will be substantially greater than 5 nm. It is precisely because of the low surface conductivity of the buffer layer that direct contact zones for contact between the two conducting layers of the upper electrode are necessary in order to ensure a conducting bridge. It should be noted that, in document U.S. Pat. No. 5,739,545, the conducting bridge between the two conducting layers of the upper electrode is provided through the intermediate (particularly ZnSe) buffer layer and not through direct contact zones as in the invention. Preferably, for each common upper electrode, the surface conductivity of the buffer layer is less than the surface conductivity of the first conducting layer of this electrode. Preferably, the surface conductivity of the buffer layer is less than one tenth of the surface conductivity of the first conducting layer. Organic materials may be used for the buffer layer, provided that they meet the above low conductivity criteria. For example, spiro-TAD, spiro-TTB, NPB, TPD, BCP or Bphen may be used. It is necessary for the organic material to be sufficiently thick to ensure that the function of protecting the subjacent organic layers is effective. Preferably, for each common upper electrode, the material of the buffer layer is inorganic, thereby providing an advantageous contribution to the encapsulation of the diodes. Preferably, this material is chosen from the group formed by silicon oxide, silicon nitride, silicon oxynitride and tantalum oxide: $SiO_x$, $SiN_y$, $TaO_z$, in which $0<x\leq2$; $0<y\leq1.33$; and $0<z\leq2.5$.

Since the buffer layer is insulating, the electrical current is transmitted between the two conducting layers of one and the same upper electrode via the direct contact zones which, according to the invention, are located between the diodes, more precisely between the active or emissive areas of the diodes.

Since the insulating buffer layer covers the contact zones between the organic electroluminescent layer and the lower electrode of the diodes, this buffer layer is capable of effectively protecting the active, i.e. emissive, zones of the organic layers during deposition of the second conducting layer of the upper electrodes, especially when this deposition is carried out under energy conditions that would run the risk of degrading the organic layers in the absence of protection.

Since the insulating buffer layer is interposed between the two conducting layers of the upper electrodes, the first conducting layer may be directly in contact with the entire area of the organic layers, thus providing, within these layers, an electric field that is uniform over this entire area so as to obtain uniform electroluminescent emission by this area.

According to an advantageous variant of the invention, this buffer layer is partitioned into separate buffer elements so that the windows or apertures in the buffer layer form on the contrary a continuous surface.

Preferably, for each common upper electrode, the material of said second conducting layer is oxide-based—it is therefore a transparent conductive oxide (TCO). Preferably, a mixed indium tin oxide (ITO) or a mixed indium zinc oxide (IZO) is used. The conditions under which such oxides are deposited would run the risk of degrading the organic layers in the absence of the protection provided by the buffer elements. Moreover, one advantage in using these mixed oxides is that they provide effective protection of the organic electroluminescent layer of the diodes against the risk of deterioration, especially by oxygen and/or water vapor in the atmosphere, and thus provide an encapsulation function.

Preferably, the thickness of the second conducting layer is equal to or greater than 100 nm. Such a thickness makes it possible to enhance the encapsulation function provided by the second conducting layer.

Preferably, for each common upper electrode, the material of said first conducting layer is metallic. Preferably, the thickness of this first conducting layer is greater than 1 nm but does not exceed 20 nm. Such a small thickness ensures transparency, especially when the material of this layer is metallic. Such a small thickness generally ensures sufficient surface conductance of one diode or a few diodes, but in general does not allow this first layer alone to have a sufficient conductance for the entire upper electrode when it is common to a large number of diodes, thereby making the second conducting layer even more useful.

Preferably, for each common upper electrode, the thickness of the second conducting layer is greater than the thickness of the first conducting layer.

Preferably, for each common upper electrode, the surface conductivity of the second conducting layer is greater than the surface conductivity of the first conducting layer. Thanks to this higher conductivity, the second layer ensures that the current is uniformly distributed over the entire surface of the panel.

The expression "surface conductivity of a layer" is to be understood to mean the conductivity of a square surface element of this layer. Such a criterion, added to the choice of a metallic, and therefore highly conductive, material for the first layer and of a conductive-oxide-based, and therefore low-conductivity, material for the second layer, means that the thickness of the second layer is much greater than that of the first layer.

The invention will be better understood on reading the following description, given by way of nonlimiting example and with reference to FIG. 1, which describes a partial sectional view of a panel according to one embodiment of the invention, in which the buffer layer is partitioned into separate buffer elements.

The structure starts with a substrate 1, integrating here an active matrix known per se, the fabrication of which will not be described in detail: a rigid plate 11 made of insulating material supports a network of control/supply circuits for the diodes, called "pixel circuits", each having an output 14 connected to a lower electrode 15, which is preferably metallic and reflective. This rigid plate generally supports several electrically insulating layers, including a first insulating layer 12, especially for isolating the components of the pixel circuits from one another, and a second insulating layer 13 for separating the diodes and isolating the lower electrodes from the upper electrodes outside the emissive areas of the diodes. At the position of the diodes, this second insulating layer 13 is pierced by windows, exposing the surface of the lower electrodes 15. Finally, this substrate integrates other arrays of electrodes (not shown), especially electrodes for driving, for example selecting and addressing, the pixel circuits.

The lower electrodes 15 are generally arranged in rows and columns, according to the arrangement of the diodes to be obtained on the panel.

An organic electroluminescent layer is deposited over all of the lower electrodes 15 by a physical deposition method, such as vacuum evaporation. To obtain different colors on the columns of diodes, different organic layers 2, 2' are deposited on adjacent columns. Masks are used for this purpose. In practice, as shown in FIG. 1, the imprecision in positioning the deposited layers resulting from the use of masks and the need, in order to avoid short circuits, to cover the entire surface of the lower electrodes 15 exposed by the windows made in the insulating layer 13, result in the deposition of organic layers 2, 2' that extend substantially beyond the boundaries of these windows.

In general, the organic layers 2, 2' are subdivided into several sublayers, especially sublayers for injecting and transporting charges (electrons or holes), an actual electroluminescent sublayer and, where appropriate, charge-blocking sublayers in order to limit non-radiative charge recombinations. Preferably, doped organic materials are used for the charge injection and transport sublayers, these materials extending the panoply of materials that can be used for the electrodes and increasing the thickness so as to obtain a planarization effect.

After the organic layers have been deposited, a first full metallic conducting layer 31 is deposited with a thickness equal to or less than 20 nm, but greater than 1 nm, so as to cover the entire active area of the substrate. This first conducting layer is continuous, with an approximately constant thickness, and without intentional holes or windows.

Next, again using deposition masks, insulating elements of the buffer layer 32 are deposited, at the position of each diode, on the first conducting layer 31. The masks used are designed so that:
  the position and the surface of the elements of the buffer layer 32 again cover the entire surface of the lower electrodes 15 exposed by the windows made in the insulating layer 13;
  the area of the insulating elements of the buffer layer 32 is sufficiently small to leave, between the diodes, i.e. between the rows and/or between the columns, broad zones not covered by the surface of the first conducting layer 31.

For this purpose it is possible to use the same masks as for the deposition of the organic layers, which require three deposition operations. It is also possible to use a specific mask, which enables the deposition to be carried out in a single operation. This mask may have apertures covering several diodes, or even entire columns or rows of diodes. In the case of a mask having only one aperture per diode, this aperture may be larger or smaller than that used for depositing the organic layers, depending on the area of the organic layer that it is desired to protect.

For these elements of the buffer layer 32, an electrically insulating transparent material adapted so as to obtain effective protection of the organic layers 2, 2' during the subsequent deposition of the second conducting layer is chosen. The thickness of the elements of the buffer layer 32 is also adapted for this purpose, without any risk here of reducing the transparency, since the material used is transparent. The term "transparent material" is understood to mean a material that transmits at least part of the electroluminescent emission spectrum of the organic layer that it covers. According to a variant of the invention, this material may also serve as an optical filter, especially so as to adapt the emission spectrum and the colorimetry of the diodes.

It is also important for the material chosen for these elements of the buffer layer 32 to be able to be deposited without any risk of the subjacent organic layers 2, 2' deteriorating.

It is preferred to choose, as material for these elements of the buffer layer 32, a mineral material which provides better protection of the subjacent organic layers than an organic material. Preferably, a material is chosen that can be deposited under what are called "mild" conditions, not running the risk of degrading the subjacent organic layers, that is to say a material which, for its deposition, does not require a substrate temperature greater than 50° C. and for which the energy of the particles that are deposited on the substrate is, during deposition, less than 100 eV. Preferably, a material having a refractive index of greater than 2 is preferred, so as to improve the level of light extraction of the upper electrode.

Thus, as material for the elements of the buffer layer 32, it is preferred to choose a silicon oxide of formula $SiO_x$, where $0<x\leq 2$, or a silicon nitride $SiN_y$, where $0<y\leq 1.33$, or a silicon oxynitride or a tantalum oxide $TaO_z$. Preferably, the values of the indices x, y or z are adapted in a manner known per se so that the buffer material has a refractive index of greater than 2. Thus, it is preferred to choose zinc selenide (ZnSe) which has a refractive index of greater than 2 and also has the advantage of being easy to evaporate by heating.

Other transparent insulating inorganic materials may be used for the buffer layer 32 without departing from the scope of the invention, such as alkali or alkaline-earth metal halides or chalcogenides.

The thickness of the buffer layer is adapted in a manner known per se so as to obtain the desired level of protection with regard to the risks of degradation of the subjacent organic layers. In practice, this generally translates to a thickness of greater than 20 nm, and the surface conductivity of this buffer layer will then be less than the surface conductivity of the second conducting layer 33 that is deposited subsequently, thereby making it necessary for there to be direct contact zones according to the invention between the two conducting layers of the upper electrode. Preferably, the surface conductivity of this buffer layer will be less than one tenth of the surface conductivity of the second conducting layer 33.

After the elements of the buffer layer 32 have been deposited, a second full conducting layer 33 is deposited with a thickness of greater than 20 nm so as to cover the entire active area of the substrate. This second conducting layer is also continuous, with an approximately constant thickness, and without any intentional holes or windows.

Thanks to the protection provided by the elements of the buffer layer 32, it is possible to use high-energy deposition methods without running the risk of degrading the subjacent organic layers.

Preferably, a material based on ITO or IZO is used for this second conducting layer 33, the material being deposited by vacuum sputtering.

As illustrated in FIG. 1, the broad zones not covered by the elements of the buffer layer 32 of the surface of the first conducting layer 31 are directly in contact with this second conducting layer 33—these zones are therefore contact zones 4.

The first conducting layer 31, the buffer layer 32 and the second conducting layer 33 therefore form here an upper electrode 3 which is common to all of the diodes of the panel that are supported by the substrate 1.

The second conducting layer 33 of this upper electrode is intended to distribute the current to be supplied to each of the diodes via the first conducting layer 32 and the contact zones 4 between these layers, which correspond to the windows or apertures in the buffer layer 32.

Preferably, the thickness of the second conducting layer 33 is greater than that of the first conducting layer 31. Preferably, the thickness of the second conducting layer 33 is adapted so that the surface conductivity of this layer is at least ten times greater than that of the first layer 31, thereby ensuring effective and uniform distribution of the electrical current supplied to the diodes.

A panel of light-emitting diodes according to the invention is thus obtained. Each diode 5, 5' of this panel has an emissive area that corresponds to a zone of overlap of its lower electrode 15 by the upper electrode 3, which, in this zone, is transparent to the light emitted by this diode, and which comprises:
- in this zone, and between these electrodes, an organic electroluminescent layer 2, 2'; and
- in this zone, and between the first 31 and second 33 conducting layer of the upper electrode 3, an element of the buffer layer 32, which is insulating and transparent.

The surface conductivity of the insulating elements of the buffer layer 32 is generally less than one tenth of that of the first conducting layer.

Without departing from the scope of the invention, the elements of the buffer layer may be distributed as separate pads, one per diode, or one element for a set of diodes, or as continuous bands each covering a row or a column of diodes, or in other configurations, provided that the arrangement of these elements of the buffer layer leaves between the diodes contact zones of sufficient area to ensure effective and uniform distribution of the current, as described above. Without departing from the scope of the invention, instead of depositing separate elements of buffer layer, as described above, it is also possible to envisage depositing a "full" buffer layer which is provided with windows emerging between the diodes in order to provide zones of direct contact with the first contact layer 31.

The present invention has been described with reference to an active-matrix light-emitting panel. It is obvious to a person skilled in the art that the invention can be applied to other types of display or illuminating panels, especially passive-matrix panels, without departing from the scope of the claims below. In the case of a passive matrix, each lower electrode is generally common to a row of diodes, and each upper electrode is generally common to a column of diodes, or vice versa. The invention applies equally well to cases in which the lower electrodes are anodes and the upper electrodes are cathodes, and to the reverse cases in which the lower electrodes are cathodes and the upper electrodes are anodes.

The invention claimed is:

1. An illuminating or image-display panel, comprising an array of organic light-emitting diodes supported by a substrate, at least one array of lower electrodes in contact with the substrate and an array of upper electrodes, in which each diode comprises an organic electroluminescent layer which is interposed between one of said lower electrodes and one of said upper electrodes, wherein said upper electrodes are transparent to the light emitted by this diode, in which at least one of said upper electrodes is common to a plurality of diodes and comprises a first conducting layer in contact with the organic electroluminescent layer, a second conducting layer overlaying the first conducting layer and a transparent intermediate buffer layer interposed between the first and second conducting layers, wherein, for each of said at least one upper electrode common to a plurality of diodes, said intermediate buffer layer is pierced by windows that provide direct contact surfaces for direct contact between the first and second conducting layers of this at least one upper common electrode, wherein the direct contact surfaces of said first conducting layer corresponds to an opposite surface of said first conducting layer that is not in contact with the organic electroluminescent layer.

2. The panel as claimed in claim 1, wherein, for each said upper electrode, the surface conductivity of said intermediate buffer layer is less than one tenth of the surface conductivity of the second conducting layer of said upper electrode.

3. The panel as claimed in claim 1, wherein, for each said common upper electrode, the surface conductivity of said intermediate buffer layer is less than the surface conductivity of said first conducting layer of said upper electrode.

4. The panel as claimed in claim 1, wherein, for each said common upper electrode, the material of said intermediate buffer layer is chosen from the group formed by silicon oxide, silicon nitride, silicon oxynitride and tantalum oxide.

5. The panel as claimed in claim 1, wherein, for each said common upper electrode, the material of said second conducting layer is oxide-based.

6. The panel as claimed in claim 5, wherein said oxide is chosen from the group formed by a mixed indium tin oxide (ITO) and a mixed indium zinc oxide (IZO).

7. The panel as claimed in claim 5, wherein the thickness of said second conducting layer is equal to or greater than 100 nm.

8. The panel as claimed in claim 1, wherein, for each said common upper electrode, the material of said first conducting layer is metallic.

9. The panel as claimed in claim 8, wherein the thickness of said first conducting layer is greater than 1 nm but does not exceed 20 nm.

10. The panel as claimed in claim 1, wherein, for each said common upper electrode, the thickness of said second conducting layer is greater than the thickness of said first conducting layer.

11. The panel as claimed in claim 1, wherein, for each said common upper electrode, the surface conductivity of said second conducting layer is greater than the surface conductivity of said first conducting layer.

* * * * *